(12) United States Patent
DeLissa et al.

(10) Patent No.: US 10,941,635 B1
(45) Date of Patent: Mar. 9, 2021

(54) OPTIMIZATION COMPUTER PROGRAM AND METHOD

(71) Applicant: East Daley Capital Advisors Inc., Parker, CO (US)

(72) Inventors: Levi Austin DeLissa, Englewood, CO (US); Justin Henry Carlson, Littleton, CO (US); Ryan Christopher Smith, Lakewood, CO (US)

(73) Assignee: EAST DALEY CAPITAL ADVISORS, INC, Parker, CO (US)

( * ) Notice: Subject to any disclaimer, the term of this patent is extended or adjusted under 35 U.S.C. 154(b) by 311 days.

(21) Appl. No.: 14/999,789

(22) Filed: Jun. 27, 2016

(51) Int. Cl.
*E21B 41/00* (2006.01)
*G06F 30/20* (2020.01)
*E21B 47/003* (2012.01)

(52) U.S. Cl.
CPC ........ *E21B 41/0092* (2013.01); *E21B 47/003* (2020.05); *G06F 30/20* (2020.01)

(58) Field of Classification Search
CPC ............. E21B 41/0092; E21B 47/0003; G06F 17/5009
USPC .......................................................... 703/2
See application file for complete search history.

(56) References Cited

U.S. PATENT DOCUMENTS

| | | |
|---|---|---|
| 6,549,879 B1 | 4/2003 | Cullick |
| 7,124,101 B1 | 10/2006 | Mikurak |
| 7,487,124 B2 | 2/2009 | Boutilier |
| 7,627,461 B2 | 12/2009 | Guyaguler |
| 8,554,704 B2 | 10/2013 | Lipets |
| 8,600,717 B2 | 12/2013 | Rashid |
| 9,115,566 B2 | 8/2015 | Amundo |
| 2009/0228309 A1 | 9/2009 | Moll |
| 2012/0203591 A1 | 8/2012 | Andoji |
| 2013/0018818 A1 | 1/2013 | Yadav |
| 2013/0246032 A1* | 9/2013 | El-Bakry ............... E21B 41/00 703/10 |
| 2014/0149153 A1 | 5/2014 | Cassandras |
| 2014/0262235 A1 | 9/2014 | Rashid |
| 2014/0278708 A1 | 9/2014 | Byk |
| 2014/0297235 A1 | 10/2014 | Arora |

(Continued)

FOREIGN PATENT DOCUMENTS

| | | |
|---|---|---|
| WO | WO 9930249 A1 | 6/1999 |
| WO | WO 2007028158 A2 | 3/2007 |

OTHER PUBLICATIONS

Kosmidis, V.D., et al, "Optimization of Well Oil Rate Allocations in Petroleum Fields," Ind Eng Chem Res (2004) 43(14):35133527. http://pubs.acs.org/doi/abs/10.1021/ie034171z.

(Continued)

*Primary Examiner* — Saif A Alhija
(74) *Attorney, Agent, or Firm* — Jaffery Watson Mendonsa & Hamilton LLP

(57) ABSTRACT

An exemplary embodiment includes a system to determine which wells provide input volumes to gas processing plants using a mixed-integer programming (MIP) model. The system uses a balanced approach to model all plants and wells within a basin simultaneously. The model utilizes multiple publically available data sources including well production data, plant inlet data, and GIS data. The full implementation provides at minimum a tenfold time improvement over the previously used manual techniques while increasing overall model quality.

24 Claims, 2 Drawing Sheets

(56) References Cited

U.S. PATENT DOCUMENTS

2014/0344198 A1  11/2014  Taits
2015/0039364 A1   2/2015  Beraudier
2016/0010445 A1   1/2016  Harrison

OTHER PUBLICATIONS

Wang. P., et al, "Optimization of production from mature fields," 17th World Petroleum Congress, Sep. 15, 2002, Rio de Janiero, Brazil, WPC32152. https://www.onepetro.org.

Cramer, R., et al, "Improving Allocation and Hydrocarbon Accounting Accuracy Using New Techniques," SPE Economics & Management (Oct. 2011) 3(4):235240. SPE125178PA. https://www.onepetro.org.

\* cited by examiner

FIG. 2

Minimize:

$$\left[\sum_{i \in Wells} \sum_{j \in Plants} x_{ij} * C_{ij}\right] + \left[\sum_{j \in Plants} \sum_{k \in Quarters} \sum_{l \in Steps} f_{jkl} * W_{jk} * P_l\right] \quad \text{(13)}$$

Subject To:

$$\sum_{j \in Plants} x_{ij} \leq 1 : \forall i \in Wells \quad \text{(14)}$$

$$\left[\sum_{i \in Wells} x_{ij} * WV_{ik}\right] + (0.001 * PV_{jk}) f_{jkl} \geq (1 - T_l) * PV_{jk} : \forall j \in Plants, k \in Quarters, l \in Steps \quad \text{(15)}$$

$$\left[\sum_{i \in Wells} x_{ij} * WV_{ik}\right] - (0.001 * PV_{jk}) f_{jkl} \leq (1 + T_l) * PV_{jk} : \forall j \in Plants, k \in Quarters, l \in Steps \quad \text{(16)}$$

Variables:

$x_{ij} \in \{0,1\}$, $x_{ij} = 1$ if well $i$ is allocated to plant $j$ and $x_{ij} = 0$ if not (17)

$f_{jkl} \in \mathbb{R}^+$ is the amount the fit exceeds the target value for plant $j$ in quarter $k$ at step $l$ (18)

Parameters:

$WV_{ik}$ is the volume of well $i$ during quarter $k$ (19)

$PV_{jk}$ is the volume of plant $j$ during quarter $k$ (20)

$T_l$ is the threshold at step $l$ (21)

$W_{jk}$ is the fit weight applied to plant $j$ for quarter $k$ (22)

$C_{ij}$ is the cost of connecting well $i$ to plant $j$ (23)

$P_l$ is the fit penalty for step $l$ (24)

OPTIMIZATION COMPUTER PROGRAM AND METHOD

BACKGROUND AND TECHNICAL FIELD

One useful embodiment or variation of the invention relates to the following field, although the invention may also relate to other fields and uses. The invention may have various embodiments and variations.

The method is useful in the technical field of mixed-integer programming (MIP) and as an industrial application in hydrocarbon analytics. The MIP model presented provides a modeling framework for determining the most plausible scenario of choices that resulted from a known set of historical events. The resulting application in hydrocarbon asset evaluation enables quicker and better decisions regarding asset evaluation while reducing labor costs.

BACKGROUND

Description of Related Art

Typical of the art related to widely useful embodiments and variations of the present invention are following patents and publications. The following examples of related art and its limitations are illustrative and not exclusive. Other limitations of the related art will become apparent to those skilled in the art upon study of the specification and drawings of this application. Other embodiments and variations of the invention may relate to other arts and uses.

U.S. Pat. No. 9,115,566—Chidi Amudo—Jun. 27, 2012 System and Method for Hydrocarbon Production Forecasting. The invention is a method for forecasting hydrocarbon production knowing all of the operational parameters of the well(s), subsurface tank(s), separator(s), and pipe network.

Similarities: The language of forecasting hydrocarbon production using a group of wells.

Differences: This method only works knowing the operational parameters such as which wells are connected to which pipes and plants whereas our invention is designed to determine such connections and does not require them as inputs. Additionally, there is no mention of mixed integer programming or similar methods used to solve the problem.

U.S. Pat. No. 8,600,717—Kashif Rashid—May 5, 2010 Production Optimization for Oilfields Using a Mixed-Integer Nonlinear Programming Model The invention is a method for optimizing the well control parameters of an interdependent set of wells using nixed-integer nonlinear programming.

Similarities: The idea of using multiple wells simultaneously as opposed to considering each separately. Additionally, this invention uses mixed-integer nonlinear programming to formulate the model similar to the mixed integer programming used in our model formulation.

Differences: This invention is different from our invention in purpose and application.

The method described is using a mixed-integer nonlinear program to determine optimal well control parameters. This is an operational question regarding how to manage wells.

Our invention is a method for determining what wells contribute volumes to each midstream asset.

The hydrocarbon value chain (typically referred to as the oil and gas industry) contains three segments. They are commonly referred to as (1) upstream, (2) midstream, and (3) downstream.

The upstream segment primarily involves extracting hydrocarbons (e.g. oil and gas) from underground reservoirs. During this process, other non-hydrocarbon compounds/elements such as carbon, sulfur, water, nitrogen are also extracted. These are often referred to as contaminants by the oil and gas industry. This extraction is primarily done through the use of wells. Upstream assets can include wells, subterranean (underground) tanks, mineral rights, and property leases.

Once the hydrocarbons reach the surface (wellhead) they must be collected and delivered to market. This entire part of the value chain is encompassed by the midstream segment.

Different types of midstream assets can include gathering pipelines, trucks, processing or treating plants, long haul pipelines, rail terminals, rail cars, fractionators, storage facilities and purity product lines. A specific example of the midstream segment involving natural gas begins by connecting each gas well to a gathering system. The gathering system is a network of connected pipelines that 'gather' all of the gas produced by the connected wells and delivers it to a gas processing plant. Because of the large costs associated with building a gathering system, wells will typically only be connected to a single gathering system. Thus, all of the gas volumes from a well will be 'dedicated' to a single processing plant.

The third segment of the hydrocarbon value chain is the downstream segment. This segment involves transferring the hydrocarbons to the end user. Examples of downstream assets can include local distribution companies (LDC), power plants, petrochemical plants or refineries. Other non-hydrocarbons are also part of the midstream process where resources such as water are disposed of or treated and reused. Elements such as sulfur can be removed and sold.

Because of the significant global demand for hydrocarbons there is a very large number assets belonging to the three different segments. For example there are hundreds of thousands of wells and hundreds of gas processing plants. These assets are operated by hundreds of different companies and are frequently bought and sold.

When buying or selling one of these assets it is important to understand not only the physical operation of the asset but both the inputs and outputs. For example, when evaluating for purchase a gas processing plant, which separates wellhead production into methane for consumer consumption and Y-Grade (mixed natural gas liquids) for further processing, one must consider how the plant gets the raw gas to be processed in addition to the actual operational parameters of the plant. This is because the most efficient processing plant in the world won't work if it doesn't have raw gas as an input. Since the input volumes are ultimately dependent on the wells producing them it becomes important to know what wells provide the plant with gas.

If one has access to proprietary (i.e. not publicly available) data about which wells are physically connected to a processing plant through a gathering system then this step of the evaluation is very simple. However, there are many situations where proprietary operational data about the well connections is unavailable. One such example would be when trying to evaluate the future value of processing plants owned by a publicly traded company to determine the risks associated with investing in that company. Because all investments made on public exchanges such as the New York Stock Exchange (NYSE) must use publicly available data the corresponding analysis of the asset risks must also use publicly available data.

Traditionally, when proprietary data about the physical well connections to processing plants is unavailable, an analyst has to build a model to determine the most likely set of wells physically connected to each processing plant. These models are built using one or more publicly available data sources such as geographic distance between the wells and processing plants, information regarding who owns each well and processing plant, the volume of gas produced by each well over time, and the volume of gas processed by the plant over time.

Once the analyst has chosen wells a set of wells that are likely connected to each processing plant it is important to determine what potential errors exist in the model.

Once such way to evaluate potential errors is to evaluate the historical fit between known plant inlet volumes and the modeled well production volumes. For example, if the analyst knows that during a certain time period a processing plant had total gas inlet volumes of 100 Mcf (1 Mcf=1000 cubic feet) of gas, that number will be compared to the production of the modeled wells for the same time period. If the modeled wells production data indicates that they produced 200 Mcf of gas during that same time period there is not a good fit between the known volumes of the plant and the known volumes of the wells. A bad fit is an indicator that the model is using the wrong set of wells.

Another way to evaluate potential errors in a model is to look at the geographical proximity between the modeled wells and the processing plant being modeled. Since the wells must be physically connected to the processing plant wells are generally connected to plants that are nearby. Thus, if the set of wells in the model is hundreds of miles away from the plant there is a good chance that the model is using the wrong set of wells.

When building a model an analyst will choose a set of wells, evaluate the historical fit and geographic proximity of the wells and iteratively adjust the set of wells until satisfied with the model. Because of the numerous factors involved a good model will likely take several iterations to get a set of wells with both a good historical fit and geographic proximity.

This approach has at least three very serious problems. First, because this is a manual and time-consuming process, it requires either a large number of analysts or a significant amount of time for a single analyst to complete this exercise for a large number of gas processing-plants.

Second, since the set of wells connected to each processing plant is modeled sequentially instead of simultaneously, it becomes impossible to prevent overlap in the analysis while also maintaining a good historical fit between the well and plant volumes for each plant. For example, when a the model for processing plant 'A' uses some of the same wells as the model for processing plant 'B' the resulting model will be incorrect of one or both of the processing plants. This is because each well can only be connected to a single processing plant. This occurrence is commonly referred to as double counting and can be a serious problem depending on how many wells are double counted. For example, if all of the wells in a certain county were allocated to both plant 'A' and plant 'B', the model would suggest that the combined volumes through plant 'A' and plant 'B' are much higher than what is actually possible. Depending on the magnitude of volumes produced by those wells this could result in an incorrect risk assessment of plant 'A' and or plant 'B'.

Thirdly, a manual approach that requires very strict definitions of geographic boundaries and/or well ownership has limited flexibility to adjust to changes in the processing plant's gathering system over time. For example, if the gathering system for processing plant 'A' were to expand its geographic footprint (i.e. area the system covers) to collect volumes from a new set of wells, the manual method would require the analyst to redefine the geographic boundaries used to model the set of wells connected to the plant. Since wells are constantly being drilled, the gathering systems are constantly expanding. This means a significant amount of time is required to maintain the models.

SUMMARY

One of the widely useful embodiments and variations of the present invention may be summarized as follows. This embodiment or variation is exemplary only. Other embodiments and variations will become apparent to those skilled in the art upon study of the specification and drawings of this application. Other embodiments and variations of the invention may relate to other arts and have usefulness in those arts.

Instead of manually determining the producing wells supplying a single processing plant, the method described herein uses a mixed-integer programming (MIP) model as a tool for simultaneously determining the producing wells supplying every processing plant in question. This approach eliminates the double counting problem, significantly reduces the amount of analyst time required to evaluate a large number of midstream assets, increases flexibility of the model, and can utilize a broad range of data sources and qualities.

The use of a MIP model is critical for solving the problem in a reasonable amount of time. Trying to simultaneously determine the producing wells dedicated to a typical number of processing plants, say 30, using a computer to try all possible combinations, without the use of mixed-integer programming, would take the world's fastest computer longer than the known life of universe. This is because of the simply enormous number of possible combinations. Using just 30 midstream assets and 150,000 wells would result in 31^150,000 possible combinations.

Simultaneously determining the producing wells likely connected to every processing plant eliminates the problem of a single producing entity being modeled as connected to multiple assets. To help understand how double counting is eliminated consider the following example. At a daycare there is a large toy box holding all of the toys available for the children to play with. Using the sequential approach each of the children is allowed to look in the toy box one at a time and select the toy they would like to play with for the day. However, once a child has chosen their toy for the day it remains in the toy box while the other kids choose their toys. Once every child has chosen, the children are instructed to go get their toy. It is extremely likely that this will be impossible because several of the children will have chosen the same toy while many of the toys were not selected by any of the children. In contrast to the sequential approach the simultaneous approach has the children all choose their toy at the same time. Although there will likely be some children that are unhappy with the toy they have, no toy will be held by two children and no child will be without a toy. Thus, simultaneously analyzing the processing plants provides more realistic and more accurate analysis in contrast to analyzing processing plants sequentially.

Moreover, the mixed-integer programming model is able to consider more data points and sources than a single analyst is capable of processing manually. This is simply due to the speed of modern computers compared to humans in regards to performing multiple numerical calculations. This dramatic improvement in the time required to analyze several midstream assets results in significant labor cost savings. Meanwhile, the improved analysis integrity results in significantly more accurate asset risk assessment results because the modeled set of connected wells model is more accurate.

The risk assessment is a determination of the commodity fundamentals supporting an asset. For example, if all of the wells providing volumes to a gas processing plant are not economical to produce gas based on current and projected forward commodity prices, then part of the risk assessment will describe the possibility of all the wells being 'shut in' (stop production) resulting in no raw gas for the plant to process. Such an occurrence would require the plant to shut down (or at least be idled).

As an extremely simple example of the MIP analysis method, consider the following simple situation for optimizing table or chair production using a fixed amount of wood. Assume a table requires 4 units of wood and 3 units of labor a chair requires 2.5 units of wood and 5 units of labor. Additionally, you can sell each table for $8 and each chair for $5. Since you only have 27 units of labor and 18 units of wood you want to choose how many chairs and tables to make. Let the number of tables be represented by the variable x and the number of chairs represented by the variable y. The objective function is to maximize 8x+5y. The wood constraint states that 4x+2.5y<=18 while the labor constraint states that 3x+5y<=27. Lastly, the variables x and y are constrained to the positive real space. This is because you cannot produce negative chairs to free up labor and wood.

DETAILED DESCRIPTION OF THE INVENTION

The working implementation is comprised of four distinct ordered steps. They are: (1) input generation, (2) formulating the model, (3) solving the model, and (4) processing the solution. All four steps should be executed on a computer using any Turing complete instruction set. A Turing complete instruction set is a set of commands that can be used to solve any problem on a Turing machine (simple tape based computer defined by Alan Turing) given an infinite amount of time and memory.

The first step, input generation, can be seen in FIG. 1 as items 1-10. There are four input matrices that are required for the MIP model to be constructed. The first input matrix contains the well volumes and is item 7 in FIG. 1. The well volumes matrix should contain the total volume, in Mcf, of hydrocarbons produced by each well during each time period in question. The preferred implementation uses a rolling three years separated into quarters as the time horizon. The non-proprietary well volumes are available from various state and federal regulatory agencies. The second input matrix contains the gas processing plant volumes and is item 8 in FIG. 1. The matrix should contain the total hydrocarbon inlet volumes, in Mcf, for each processing plant in question for each of the time periods used in the well volumes matrix. Some of the non-proprietary inlet volumes are available from various state and federal regulatory agencies.

Additionally, inlet volumes can be determined using the reported flow from regulated gas meters on interstate pipelines. Finally, some inlet volumes can be found in investor presentations distributed by the operating company.

To better understand how all of these steps are connected please refer to FIG. 1. Basically, the process involves organizing several different data sources into 4 input matrices. These matrices are then feed into the MIP model which is then solved to produce the optimal combination of well to plant allocations. The data is all publically Available data collected from numerous state and federal regulatory agencies.

The third input matrix is the pseudo cost matrix and can be seen as item 9 in FIG. 1. Pseudo cost is explained in this paragraph below on the theory that each well is physically connected to a gas processing plant, and the theoretical cost of that physical connection considering the distance and construction costs—e.g. pipeline cost. The pseudo cost matrix represents the relative assumed cost of "dedicating" (i.e. a theoretical physical connection cost) the hydrocarbon volume of each well to each processing plant. For example, consider four processing plants, at different distances form well number 1, labeled A-D with the corresponding pseudo costs of −1, 1, 10, and 9999 for well number 1. In this scenario there is a slight benefit from dedicating well number 1 to plant A, a slight cost for plant B, a larger cost for plant C, and an extremely high cost for dedicating well number 1 to plant D. These dedication costs or pseudo costs are based on the distances of the plants from well number 1 and the theoretical construction cost of a physical connection. Since the model is trying to minimize the overall solution cost (i.e. lower pseudo cost values are incentivized over higher pseudo cost values), there is a greater likelihood that well 1 will be dedicated to plant A than plant D. However, if the volumes from well number 1 improve the fit (i.e. difference between modeled well volumes and known plant input volumes) for plant D by more than 9999, then the model may choose plant D because it helps to minimize the overall solution cost. The pseudo kusts are calculated using various different publicly available data sources such as GIS data, analyst experience, news releases, and well and plant ownership information and other well metadata. For example, if a group of wells is marked as belonging to company A, and company A has a processing plant nearby, then those wells may receive a low pseudo cost. In contrast, if a known competitor's plant is nearby, that same group of wells might receive a high pseudo cost for connecting to the competitor's plant. This has the effect of telling the model that the wells are much more likely connected to the plant owned by company A as opposed to the competitor's plant. Another example of assigning pseudo costs using GIS data would be making the pseudo cost represent the physical distance a well is from each plant. This reflects the assumption that operators would rather connect a well to a plant nearby than spend the extra cost for connecting it to a plant far away. The implementation of the pseudo cost assignment algorithm, seen as item 5 in FIG. 1, is a series of rules for each plant that are checked sequentially until a rule is true and a pseudo cost is assigned for each well. For example, the first rule might check if the well is greater than 100 miles from the plant. If so, the rule is true and a high pseudo cost, say 1000, would be assigned because the well is not close to the plant. However, if the well is within 100 miles, the rule would evaluate to false causing the algorithm to check for the next rule. This process would repeat for each well and processing plant until a rule evaluates to true and a pseudo cost is assigned.

The fourth input matrix represents the fit weight (i.e. importance) of each historical data point and is represented as item 10 in FIG. 1. The fit is the difference between the total volumes produced by the wells in the model compared to the total inlet volumes of the plant for that same time period. For example, consider two processing plants 'A' and 'B'. Plant 'A' may have volumes 100, 102, and 104 over 3 time periods while plant 'B' has volumes of 50, 55, and ? (unknown). In this case the fit weights for plant 'A' would be 1, 1, and 1 because we want the model to fit all 3 data points while the fit weights for plant 'B' would be 1, 1, and 0 because we don't want the model to fit the last time period for plant 'B'. The fit weight matrix should contain a real number from the inclusive interval 0 to 1 for each plant and time period in question. This weight is used to scale the fit importance for each data point. For example if you have a missing data point for one plant, you can set the fit for that plant and time period combination to 0 which has the effect of telling the model to ignore that point. This is obviously not as ideal as having all of the data points, but far superior to eliminating that time period for all plants because 1 plant is missing a data point for a time period. The implementation of the fit weight matrix uses multiple data sources such as news releases, regulatory plant data, and pipeline flow data. The algorithm for assigning the fit weights can be seen in FIG. 1 as item 6. It simply is a set of rules for determining if each data point is valid. If a point is valid, it is assigned a weight of 1. If a point is missing, it is assigned a weight of 0 and if a point is uncertain it is assigned a value less than 1 but greater than 0 based on the level of certainty.

The next main step of the method is the formulation of the MIP model. Every MIP has an objective function, a set of decision variables, and a set of constraints. See FIG. 2. The constraints form a set of mathematical expressions used to define a polyhedron in a multidimensional space with a dimension for each decision variable. Finally, the objective function is a function for ranking any feasible points contained within the polyhedron formed by the constraints. A feasible point is any answer that does not violate any constraints.

The decision variables can conceptually be divided into two sets. The first set is the allocation variables and the second set is the fit variables. The allocation variables are binary variables and can be seen in FIG. 2 as item 17. There is an assumed or theoretical allocation variable for every well and plant combination. For example, if the variable $x_{ij}$ is 1 then all of well i's volumes are assumed dedicated or allocated to plant j. The second set of variables are the fit variables which can be seen in FIG. 2 as item 18. The fit variables are restricted to the positive real number space. There is a fit variable for every combination of plant, time periods, and steps. The set of steps is used as a piecewise approximation of squared error. The set of steps means that the plant volumes during each time period are compared to the modeled well volumes multiple times. Thus, it is possible to check for fit errors at multiple points. For example, the steps would allow you to check for errors of 1%, 5%, and 10% at the same time. In the preferred implementation, there are 5 steps (0.005, 0.01, 0.02, 0.04, 0.08). This allows the model to check for fit violations of 0.5%, 1%, 2%, 4%, and 8%.

There are two different sets of constraints. The first set of constraints is the allocation constraints. The allocation constraints can be seen in FIG. 2 as item 14. There is an allocation constraint for every well. The allocation constraints represent that a well can at most be allocated to one plant. Formally, $\Sigma_{j \in Plants} x_{ij} \leq 1 \forall i \in Wells$. The second set of constraints is the fit constraints. The fit constraints don't serve an anecdotal purpose other than making the fit variables behave as described previously. In other words, the two fit constraints are absolutely critical to making the model work from a mathematical perspective, but there is no way to describe them except in a purely mathematical way. There are two fit constraints for every combination of plants, time periods, and steps. The fit constraints can be seen in FIG. 2 as items 15 and 16. Formally the fit constraints can be represented as $[\Sigma_{i \in Wells} x_{ij} * WV_{ik}] + (0.001 * PV_{jk}) f_{jkl} \geq -(T_l * PV_{jk}) + PV_{jk} \forall j \in Plants, k \in Quarters, l \in Steps$ and $[\Sigma_{i \in Wells} x_{ij} * WV_{ik}] - (0.001 * PVjkfjkl \leq Tl * PVjk + PVjk \forall Plants, k \in Quarters, l \in Steps$.

The objective function can be seen in FIG. 2 as item 13. The objective function is to minimize the sum of all the pseudo costs for the allocated variables plus the sum of the fit violation penalties. The fit penalties is a set of coefficients used to penalize fit values exceeding certain thresholds described in item 21. For example, with a step 1 threshold of 1% and a step 1 penalty of 10, the objective function is penalized by 10 for every unit of fit error greater than 1%. Additionally, with a step 2 threshold of 10% and a step 2 penalty of 50, the objective function is penalized by 50 for every unit of fit error greater than 10%. In the preferred implementation, the fit violation penalties are 1, 1, 2, 4, and 8 for the five piecewise steps. This creates a piecewise approximate squared error because a violation at any step will also be a violation at any previous step resulting in the total error being the sum of the penalties. Formally, the objective function is defined as $[\Sigma_{i \in Wells} \Sigma_{j \in Plants} x_{ij} * C_{ij}] + [\Sigma_{j \in Plants} \Sigma_{k \in Quarters} \Sigma_{l \in Steps} f_{jkl} * W_{jk} * P_l]$. Since the objective function ranks feasible solutions, one wants to choose the feasible point with the lowest objective value as the optimal solution. Practically this means choosing the solution that provides the best overall combination of historical fit while choosing well and plant combinations with low pseudo costs.

The third main step of the method is to solve the model. Once a MIP model has been formulated, it is considered solved when the feasible point producing the best objective value has been found, or when the model is declared unbounded or infeasible. A point is considered feasible if it does not violate any of the model constraints. A point has the best objective value (optimal solution) if there is no other feasible point that has a smaller result from the objective function. These last two cases will never occur with this model because all of the pseudo costs must take a finite value and setting all the allocation variables to 0 is feasible (although not optimal). There are several commercially available software products that can be used for solving MIPs. Some examples include CPLEX offered by IBM Corporation 1 New Orchard Road Armonk, N.Y. 10504-1722 United States and Gurobi Optimizer offered by Gurobi Optimization, Inc. 3733-1 Westheimer Rd. #1001Houston Tex. 77027 USA. In addition to one of the commercially available solvers, there are numerous heuristic techniques for solving MIPs. Examples of heuristics used would be simulated annealing (as described by Scott Kirkpatrick et. Al 1983)(Kirkpatrick, S.; Gelatt Jr, C. D.; Vecchi, M. P. (1983). "Optimization by Simulated Annealing". Science 220 (4598): 671-680); and genetic algorithms (based on the work of Nils Aall Barricelli 1954) (Barricelli, Nils Aall (1954). "Esempi numerici di processi di evoluzione". Methodos: 45-68). Any of the before mentioned techniques can be used in implementing this method.

The last step of the method is to transform the output matrix of the optimization model back into usable information. In this case the output of the model is the optimal set of allocation variables. Recall that variable $x_{ij}$ is 1 if well i is allocated to plant j. Thus, to process the model output, the method iterates through the allocation variables recording the corresponding well and plant combination for every variable that is set to 1.

Purposes and Advantages

The invention may have various embodiments and variations and may be useful in different fields and for different purposes. The purposes and advantages of the more widely useful embodiments or variations of the present invention include, but are not limited to, the following, and may include other purposes and advantages in different fields of use not listed herein:

1. One benefit of the invention is the significant reduction in the amount of time required to determine the producing entities (for example, but not limited to, wells) providing volumes to each asset (such as, but not limited to, hydrocarbon processing plants). Traditionally, each asset would require 4 hours of an analyst's time, whereas the model described herein has solved for over 30 assets in 1 hour. Thus, an approximate savings of 119 hours per 30 assets. There are several hundred assets that need to be evaluated every fiscal quarter. The inventors believe that the methods and software described herein, solve the problems of the oil and gas industry, and other industries, several orders of magnitudes better and faster that existing methods, and therefore represent a very significant expansion of computers and software capabilities to real world problems which are impractical to solve otherwise.

2. Another benefit of the invention is the quality of analysis. Traditional analysis would oftentimes double count wells. This would lead to significant over or under valuation for several assets. The model described herein eliminates double counting completely.

3. This method could also be used to audit and error check data reported to state and regulatory agencies or against proprietary data from a reporting company 4. This method could also be used to determine business development plans in a competitive landscape by enabling midstream operators to determine large groupings of wells which may be dedicated to a competitor's system. This knowledge would be very helpful when renegotiating gathering and processing contracts.

5. This method could be used, and has very successfully been used, to help investors understand the risks of current and future investments.

6. The assignee of this patent application has charged substantial consulting fees to clients contemplating investment in various midstream and downstream assets, with the consultation being the data results of the above analysis process.

BRIEF DESCRIPTION OF THE DRAWINGS

FIG. 2 is a formal definition of the mixed-integer programming (MIP) model.

Figure 1:
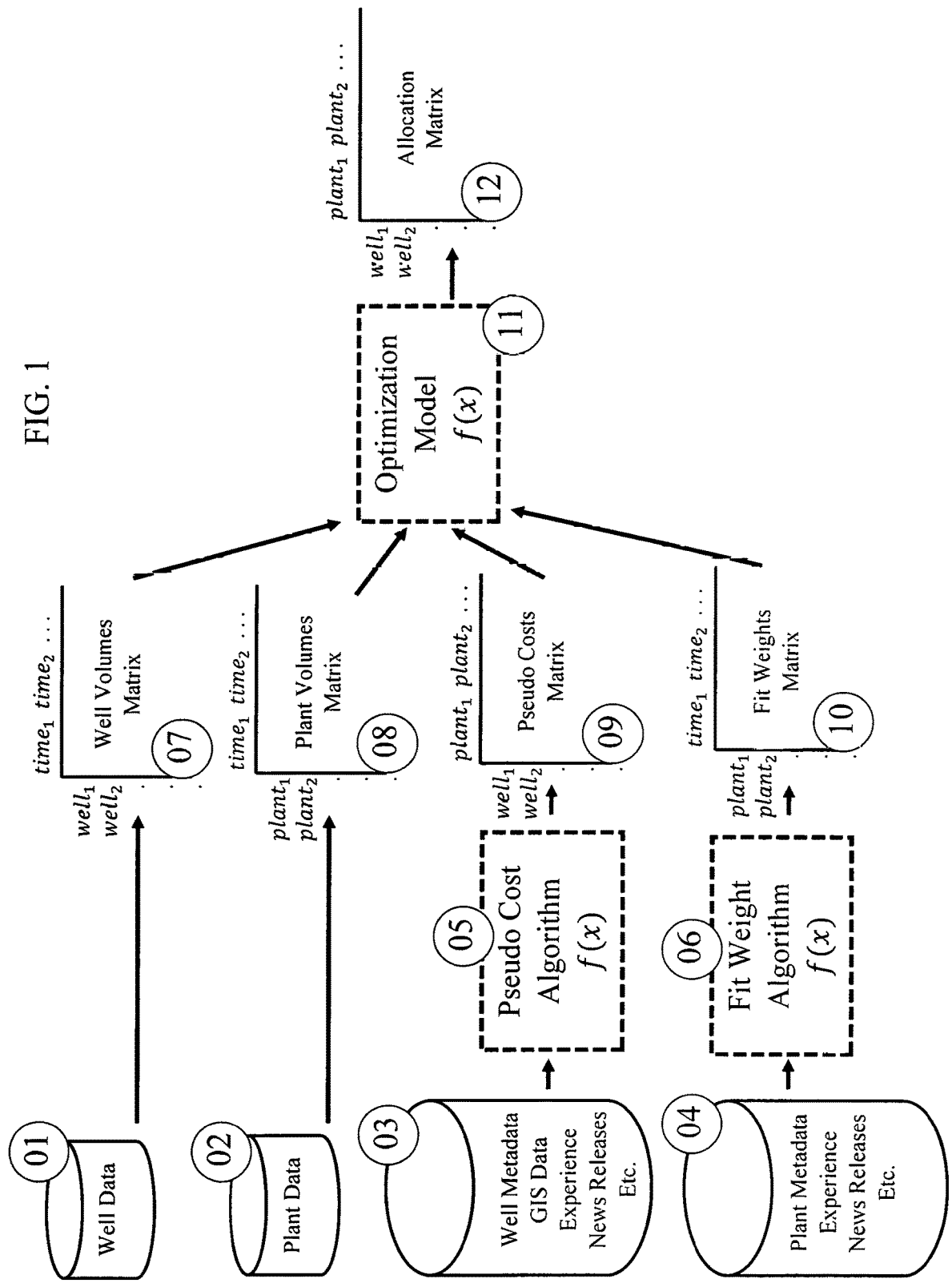
FIG. 1 represents the flow of data throughout the model.

This Brief Description and the Detailed Description of the Drawings cover only some embodiments and variations of the invention, and other embodiments and variations will be clear to those skilled in the art from the description, drawings, and Alternative and Additional Embodiments, etc. The Drawings are illustrative and not limiting.

DETAILED DESCRIPTION OF THE DRAWINGS

Item 1: Represents a publically available dataset of hydrocarbon producing entities, for example well production over time. Traditionally such a dataset would be stored in a relational database. A relational database is a digital database whose organization is based on one or more tables (or relations) of columns and rows, with a unique key identifying each row. Generally, each table/relation represents one 'entity type' (such as customer or product). The rows represent instances of that type of entity (such as 'Lee' of 'chair') and the columns represent values attributed to that instance (such as address or price).

Item 2: Represents a publically available dataset of gas processing plant inlet volumes, for example plant inlet volumes over time. Traditionally such a dataset would be stored in a relational database.

Item 3: Represents several publically available datasets including but not limited to well metadata, GIS data, and oil and gas related news releases. Well metadata includes things such as but not limited to legal well name, well owner, first production date, well depth, and well permit number. GIS data includes things such as but not limited to well latitude and longitude pairs, well county and state, and township, range, section, and quarter information. News releases would include things such as service interruption announcements, ownership changes, and bankruptcies notices. Traditionally such a datasets would be stored in a relational database.

Item 4: Represents several datasets including but not limited to processing plant data and news releases. Plant metadata can include things such as but not limited to plant ownership, plant capacity, and plant startup date. Traditionally such dataset would be stored in a relational database.

Item 5: Represents an algorithm used to assign pseudo costs to each well and plant combination. The pseudo cost of connecting a well to a plant is a number that represents the expected relative cost of connecting the well to that plant considering criteria such as proximity and ownership. Higher pseudo costs indicate a low probability that a well is connected to a plant, whereas a low pseudo cost indicates a high probability that a well is connected to the corresponding plant. The algorithm is designed to be executed on a computer using any Turing complete instruction set. A Turing complete instruction set is a set of commands that can be used to solve any problem on a Turing machine (simple tape based computer defined by Alan Turing) given an infinite amount of time and memory.

Item 6: Represents an algorithm used to assign the fit weight to each plant and time period combination. The fit weight is a number (typically between 0 and 1 inclusive) that represents the importance of matching the modeled well volumes to the known plant volumes. A value of 0 indicates that the model should ignore the volumes for that time period and plant combination. A value of 1 indicates that the model should give a high importance to the volumes for that time period and plant combination. A value of 0.5 would indicate that the model should consider the volumes for that time period and plant combination but with half the importance of a fit of 1. The algorithm is designed to be executed on a computer using any Turing complete instruction set.

Item 7: Represents a matrix of hydrocarbon production volumes for every well and time period combination. The matrix coefficient number for well 'i' and time period 'j' will be the total volume (in Mcf) of gas produced by that well in that time period.

Item 8: Represents a matrix of gas processing plant inlet volumes for every plant and time period combination. The matrix coefficient number for plant 'i' and time period 'j' will be the total inlet volume (in Mcf) at the processing plant in that time period.

Item 9: Represents a matrix of pseudo costs for every well and processing plant combination. This matrix is the output of the pseudo cost algorithm shown in item 5. The coefficient number for well 'i' and plant 'j' will be the pseudo cost of connecting that well to the plant.

Item 10: Represents a matrix of fit weights for every plant and time period combination. This matrix is the fit weight for every plant and time period combination and is the output of the fit weight algorithm shown in item 6. The coefficient number for plant 'i' and time period 'j' will be the fit weight of matching the volumes for that plant and time period combination.

Item 11: Represents the formulation and solving of a mixed-integer programming model. The model can be formulated and solved using a computer and any Turing complete instruction set. A model is solved when the feasible point with the best objective function value has been found. A feasible point is any combination of decision variables that satisfies all of the constraints. Because this point has the best objective value, it will be the optimal solution.

Item 12: Represents a matrix of binary allocation variables for every well and plant combination. This matrix is the optimal solution of the MIP model. Since this matrix is the optimal feasible point from the model, all of the well allocations in this matrix represent a well being connected to a plant. For example, if the matrix coefficient for well 'i' and plant 'j' is equal to 1, then model is indicating that well 'i' should be connected to plant 'j'.

Item 13: Represents the objective function of the MIP model. The objective function is a way to rank the quality of different solutions. For example, in one possible solution well 'i' may be connected to plant 'j' and in a different solution well 'i' could be connected to plant 'j+1'. The model will calculate the objective value for the two different solutions, say 10 and 20 respectively and choose the solution with the best value. In this case the first solution would be considered better than the second because the objective function is set to minimize the value.

Item 14: Represents the set of allocation constraints in the MIP model. There is an allocation constraint for each well in the model. Each well specific constraint states that that well can at most be allocated to 1 plant.

Item 15: Represents the first set of fit constraints in the MIP model. The first set of fit constraints forces the fit variables to behave as expected in cases where the modeled plant volumes are lower than the historical plant volumes. For example, if the modeled volumes are 10 Mcf lower than the historical volumes for a specific plant and time period, this constraint would force the fit variable to be at least 10 for that quarter.

Item 16: Represents the second set of fit constraints in the MIP model. The second set of fit constraints forces the fit variables to behave as expected in cases there the modeled plant volumes are higher than the historical plant volumes. For example, if the modeled volumes are 10 Mcf higher than the historical volumes for a specific plant and time period, this constraint would force the fit variable to be at least 10 for that quarter.

Item 17: Represents the set of allocation variables for the MIP model. There is an allocation variable for every well and plant combination. If the variable is 1, then the corresponding well is allocated to the corresponding plant. Otherwise the well is not allocated to that plant. These variables are dependent on the allocation constraints to behave as described.

Item 18: Represents the set of fit variables for the MIP model. The fit variables represent the maximum absolute deviation between the modeled wells and the historical inlet volumes for each plant and time period. These variables are then used in the objective function to rank the different solutions.

Item 19: Represents an individual element from the set of well volumes. This individual element is the total production volume (in Mcf) of gas produced by the corresponding well in the corresponding time period.

Item 20: Represents an individual element from the set of plant volumes. This individual element is the total inlet volume (in Mcf) of gas to the corresponding plant in the corresponding time period.

Item 21: Represents an individual element from the set of threshold values. The set of threshold values is a set of scalar coefficients used to relax the fit between the modeled volumes and the historical volumes. For example, if the threshold value is 0.01, then the modeled volumes will be considered a match if they are within 1% of the actual volumes.

The set of threshold values contains several different steps with increasing values. This allows for the objective function to assign exponentially larger penalties (using the penalties described in item 24) for fits exceeding certain thresholds.

Item 22: Represents an individual element from the set of fit weights described in item 10.

Item 23: Represents an individual element from the set of pseudo costs described in item 9.

Item 24: Represents an individual element from the set of fit penalties. The fit penalties is a set of coefficients used to penalize fit values exceeding certain thresholds described in item 21. For example, with a step 1 threshold of 1% and a step 1 penalty of 10, the objective function is penalized by 10 for every unit of fit error greater than 1%. Additionally, with a step 2 threshold of 10% and a step 2 penalty of 50, the objective function is penalized by 50 for every unit of fit error greater than 10%.

In this Detailed Description of the Drawings, and elsewhere in this application, "well" could be replaced by "commodity producing location" (CPL) in order to show the broader application of the method. Likewise in FIGS. 1 and 2, "well" could be replaced by "CPL". See the claims. In this application, drawings, and claims, the terms "plant" and "commodity processing plant" and the like could include any centralized collection point such as a storage facility, treatment plant, processing plant, gathering line or distribution facility.

Description—Preferred Embodiment

The following embodiment or variation of the invention is the embodiment presently preferred by the Inventors, but over time other embodiments and variations and uses in other areas may become preferred to those skilled in the art.

See detailed description of one embodiment of the invention above.

Operation of One Embodiment

The latest version of the model at the time of this writing is implemented using a computer with an Intel i7 processor, 16 GB of RAM, and a 512 GB solid state hard drive. The MIP solver used is a set of C libraries written and licensed by Gurobi Optimization, Inc., 3733-1 Westheimer Rd. #1001 Houston Tex. 77027 USA. The execution time varies slightly based upon the number of wells, processing plants, and time periods being evaluated. The largest instance solved to date contained 160,000 wells, 30 processing plants, and 12 time periods. This model took approximately 1 hour to solve to optimality. Any other program and methods know to the inventors would have taken orders of magnitude longer, and would not have been practical without the simplifying assumptions such as reducing the fit tolerances between historical and modeled volumes.

Tests of One Embodiment

The largest implementation was able to determine what wells were behind every processing plant in the Permian Basin in Texas and New Mexico. Similar, yet lower quality, analysis performed manually would have taken approximately 120 hours compared to the 1 hour required using the method described herein.

Additionally, several of the plants were manually evaluated to compare the quality of analysis. For the plants analyzed manually, the sum of squared error was more than double that of the MIP model. Squared error was used because it gives exponentially larger penalties for larger errors. For example, if the difference between the modeled volumes and the actual volumes for three time periods was 1, 4, and 10, the sum of squared error would be $1^2+4^2+10^2=118$. Thus, the MIP model provides significantly better fit in less time.

This method has very successfully been used, to help investors understand the risks of current and future investments. Additionally, the assignee of this patent application has charged substantial consulting fees to clients contemplating investment in various midstream and downstream assets, with the consultation being the data results of the above analysis process.

Additional Embodiments

An additional embodiment of the application would be a method for scaling all of the numerical inputs to improve computational efficiency and accuracy. For example, dividing all of the inputs by 2 would be considered scaling the input, but this is not a significant difference. Additionally, any addition of dummy variables, such as a new variable y that has a constant value, could be reduced (transformed) to the same model providing no actual difference between the model formulations. Another embodiment might use additional datasets to determine the well pseudo costs. An example of one such dataset would be geologic data defining what type of rock is being produced by each well. Although this may prove to be useful, it is conceptually identical to the method described herein.

Alternative Embodiments

Alternative embodiments could be used to allocate any type of entity that produces a numerical output to an entity that aggregates those outputs. For example, instead of gas wells and processing plants, you could determine the oil wells behind crude pipelines. Another example would be determining what oil wells dispose of their saltwater at different salt-water injection wells. Another example would be determining which sections of ground are used to supply a rail terminal with grain based on distance and price. In addition, the method could be used for mines producing ore, ore going to smelters, metal from smelters going to metal fabricators, fabricated product s going to buyers, etc. In summary, the method could be used for tracing the movement or flow of many different products through a sequence of origination of the product, processing the product, distributing the product etc.

CONCLUSIONS, RAMIFICATIONS AND SCOPE

A number of changes are possible to the methods and software and uses described above while still remaining within the scope and spirit of the invention. The specifics about the form and use of the invention described in this application (including the specifics in the Background, Field, Related Art, Summary, Purposes and Advantages, Abstract, Preferred Embodiment, Additional Embodiments, and Alternative Embodiments, Descriptions of the Drawings, etc.) are examples and are not intended to be limiting in scope. The methods and software could be applied to industries outside the oil and gas industry, where any product involves a sequence of processing steps and locations. Those skilled in the art will recognize certain variations, modifications, permutations, additions, subtractions and sub-combinations thereof, and may discover new fields of use. The scope of the invention is to be determined by the claims and their legal equivalents, not the examples, purposes, summary, preferred embodiments, alternative or additional embodiments, operation, tests, parameters, or limitations etc. given above. It is intended that the claims are interpreted to include all such variations, modifications, additions, subtractions, permutations and sub-combinations as are within their true spirit and scope, including those which may be recognized later by those skilled in the art.

Aspects, as described above, may be implemented in many different forms of software, firmware, and hardware in the implementations illustrated in the figures. The actual software code or specialized control hardware used to implement these aspects is not limiting of the description provided herein. Thus, the operation and behavior of the aspects were described without reference to the specific software code—it being understood that software and control hardware can be designed to implement the aspects based on the description herein by a person of ordinary skill in the art.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the present application should be construed as critical or essential to the invention unless explicitly described as such. Also, as used herein, the article "a" or "an" is intended to include one or more items. Where only one item is intended, the term "one" or similar language is used. Further, the phrase "based on" is intended to mean "based, at least in part, on" unless explicitly stated otherwise.

We claim:
1. A method comprising:
receiving, at a processing device, one or more datasets relating to hydrocarbon production associated with at least one of a set of wells and a set of plants, wherein the set of wells and the set of plants form one or more well-plant combinations;
processing the one or more datasets based on pseudo costs and fit weights, wherein processing includes assigning a pseudo cost to each of the one or more well-plant combinations, wherein processing further includes assigning one or more fit weights to one or more plant-time period combinations involving one or more plants of the set of plants and one or more time periods of a set of time periods associated with the one or more plants;
preparing to formulate a mixed-integer programming (MIP) model for the set of time periods based on the set of wells, the set of plants, a set of quarters, and a set of steps, wherein the MIP model facilitates determination of which of the set of wells are connected to which of the set of plants during a specific time period of the set of time periods;

formulating, based on a set of parameters, the MIP model on one or more matrices associated with the one or more datasets, wherein the MIP model includes a set of constraints, a set of decision variables, and an objective function, wherein the set of parameters includes well volume parameters, plant volume parameters, threshold parameters, fit weight parameters, pseudo cost parameters, and fit penalty parameters, wherein a well volume parameter refers to a well-quarter combination representing designation of at least one well to at least one quarter, wherein a plant volume parameter refers to a plant-quarter combination representing designation of at least one plant to at least one quarter, wherein a threshold parameter references each of the set of steps, wherein a fit weight parameter refers to another plant-quarter combination representing designation of at least one plant to at least one quarter, wherein the pseudo cost parameter refers to a well-plant combination representing designation of at least one well to at least one plant, and wherein the fit penalty parameter references each of the set of steps;

solving the MIP model upon reaching a feasible point with a minimum objective value, wherein the feasible point is reached when the set of constraints is satisfied by the set of decision variables; and outputting a matrix of binary allocation variables for well-plant combinations between the set of wells and the set of plants, wherein the matrix of binary allocation variables is based on the feasible point of the MIP model.

2. The method of claim 1, wherein the MIP model is associated with a first group of components including allocation variables depending on allocation constraints, or a second group of components including fit variables depending on fit constraints such that the second group is an extension of the first group, wherein an allocation constraint of the first group represents well-plant combinations, and wherein the second group represents plant-time combinations such that a fit variable represents a maximum absolute deviation between modeled wells and historical inlet volumes for each plant and time period, wherein the one or more datasets comprise one or more of well data representing well production over time associated with the set of wells, plant data representing plant inlet volumes over time associated with the set of plants, well metadata relating to the set of wells, and plant metadata relating to the set of plants.

3. The method of claim 1, wherein the pseudo cost comprises a number representing a cost associated with connecting a well with a plant based on factors including one or more of distance between the well and the plant and ownership value associated with the well or the plant, wherein a high pseudo cost indicates low probability of a connection between the well and the plant, wherein a low pseudo cost indicates high probability of the connection between the well and the plant, and wherein the fit weight comprises a value representing importance of matching modeled well volumes to known plant volumes, wherein the value of 0 indicates low importance of the matching, wherein the value of 1 indicates high importance of the matching, wherein the value of 0.5 indicates moderate importance of the matching.

4. The method of claim 1, wherein the one or more matrices comprises one or more of a well volumes matrix representing a matrix of hydrocarbon production volumes for each well over time, a plant volumes matrix representing a matrix of gas processing plant inlet volumes for each plant over time, a pseudo costs matrix representing a matrix of pseudo costs for each well and each plant, and a fit weights matrix representing a matrix of fit weights for each well and each plant.

5. The method of claim 1, wherein the feasible point represents a lowest objective function value of objective function values, wherein the lowest object function value is indicative of meeting of a threshold when the set of decision variables satisfy the set of constraints associated with the MIP model, wherein the objective function values correspond to rankings of solutions for the MIP mode.

6. The method of claim 1, wherein the matrix of binary allocation variables is offered as a lowest solution of the MIP model based on the feasible point, wherein each element in the matrix indicates whether a specific well is allocated to a specific plant and wherein each of the set of wells is connected to at most one of the set of plants.

7. An apparatus comprising:

one or more processors coupled to a memory, the one or more processors to:

receive one or more datasets relating to hydrocarbon production associated with at least one of a set of wells and a set of plants, wherein the set of wells and the set of plants form one or more well-plant combinations;

process the one or more datasets based on pseudo costs and fit weights, wherein processing includes assigning a pseudo cost to each of the one or more well-plant combinations, wherein processing further includes assigning one or more fit weights to one or more plant-time period combinations involving one or more plants of the set of plants and one or more time periods of a set of time periods associated with the one or more plants;

prepare to formulate a mixed-integer programming (MIP) model for the set of time periods based on the set of wells, the set of plants, a set of quarters, and a set of steps, wherein the MIP model facilitates determination of which of the set of wells are connected to which of the set of plants during a specific time period of the set of time periods;

formulate, based on a set of parameter, the MIP model based on one or more matrices associated with the one or more datasets, wherein the MIP model includes a set of constraints, a set of decision variables, and an objective function, wherein the set of parameters includes well volume parameters, plant volume parameters, threshold parameters, fit weight parameters, pseudo cost parameters, and fit penalty parameters, wherein a well volume parameter refers to a well-quarter combination representing designation of at least one well to at least one quarter, wherein a plant volume parameter refers to a plant-quarter combination representing designation of at least one plant to at least one quarter, wherein a threshold parameter references each of the set of steps, wherein a fit weight parameter refers to another plant-quarter combination representing designation of at least one plant to at least one quarter, wherein the pseudo cost parameter refers to a well-plant combination representing designation of at least one well to at least one plant, and wherein the fit penalty parameter references each of the set of steps;

solve the MIP model upon reaching a feasible point with a minimum objective value, wherein the feasible point is reached when the set of constraints is satisfied by the set of decision variables; and output a matrix of binary allocation variables for well-plant combinations between the set of wells and the set of plants, wherein the matrix of binary allocation variables is based on the feasible point of the MIP model.

8. The apparatus of claim 7, wherein the MIP model is associated with a first group of components including allocation variables depending on allocation constraints, or a second group of components including fit variables depending on fit constraints such that the second group is an extension of the first group, wherein an allocation constraint of the first group represents well-plant combinations, and wherein the second group represents plant-time combinations such that a fit variable represents a maximum absolute deviation between modeled wells and historical inlet volumes for each plant and time period, wherein the one or more datasets comprise one or more of well data representing well production over time associated with the set of wells, plant data representing plant inlet volumes over time associated with the set of plants, well metadata relating to the set of wells, and plant metadata relating to the set of plants.

9. The apparatus of claim 7, wherein the pseudo cost comprises a number representing a cost associated with connecting a well with a plant based on factors including one or more of distance between the well and the plant and ownership value associated with the well or the plant, wherein a high pseudo cost indicates low probability of a connection between the well and the plant, wherein a low pseudo cost indicates high probability of the connection between the well and the plant, and wherein the fit weight comprises a value representing importance of matching modeled well volumes to known plant volumes, wherein the value of 0 indicates low importance of the matching, wherein the value of 1 indicates high importance of the matching, wherein the value of 0.5 indicates moderate importance of the matching.

10. The apparatus of claim 7, wherein the one or more matrices comprises one or more of a well volumes matrix representing a matrix of hydrocarbon production volumes for each well over time, a plant volumes matrix representing a matrix of gas processing plant inlet volumes for each plant over time, a pseudo costs matrix representing a matrix of pseudo costs for each well and each plant, and a fit weights matrix representing a matrix of fit weights for each well and each plant.

11. The apparatus of claim 7, wherein the feasible point represents a lowest objective function value of objective function values, wherein the lowest object function value is indicative of meeting of a threshold when the set of decision variables satisfy the set of constraints associated with the MIP model, wherein the objective function values correspond to rankings of solutions for the MIP mode.

12. The apparatus of claim 7, wherein the matrix of binary allocation variables is offered as a lowest solution of the MIP model based on the feasible point, wherein each element in the matrix indicates whether a specific well is allocated to a specific plant and wherein each of the set of wells is connected to at most one of the set of plants.

13. A data processing system comprising:
a computing device including:
memory having instructions; and
one or more processors to execute the instructions to:
receive one or more datasets relating to hydrocarbon production associated with at least one of a set of wells and a set of plants, wherein the set of wells and the set of plants form one or more well-plant combinations;

process the one or more datasets based on pseudo costs and fit weights, wherein processing includes assigning a pseudo cost to each of the one or more well-plant combinations, wherein processing further includes assigning one or more fit weights to one or more plant-time period combinations involving one or more plants of the set of plants and one or more time periods of a set of time periods associated with the one or more plants;

prepare to formulate a mixed-integer programming (MIP) model for the set of time periods based on the set of wells, the set of plants, a set of quarters, and a set of steps, wherein the MIP model facilitates determination of which of the set of wells are connected to which of the set of plants during a specific time period of the set of time periods;

formulate, based on a set of parameters, the MIP model based on one or more matrices associated with the one or more datasets, wherein the MIP model includes a set of constraints, a set of decision variables, and an objective function, wherein the set of parameters includes well volume parameters, plant volume parameters, threshold parameters, fit weight parameters, pseudo cost parameters, and fit penalty parameters, wherein a well volume parameter refers to a well-quarter combination representing designation of at least one well to at least one quarter, wherein a plant volume parameter refers to a plant-quarter combination representing designation of at least one plant to at least one quarter, wherein a threshold parameter references each of the set of steps, wherein a fit weight parameter refers to another plant-quarter combination representing designation of at least one plant to at least one quarter, wherein the pseudo cost parameter refers to a well-plant combination representing designation of at least one well to at least one plant, and wherein the fit penalty parameter references each of the set of steps;

solve the MIP model upon reaching a feasible point with a minimum objective value, wherein the feasible point is reached when the set of constraints is satisfied by the set of decision variables; and output a matrix of binary allocation variables for well-plant combinations between the set of wells and the set of plants, wherein the matrix of binary allocation variables is based on the feasible point of the MIP model.

14. The data processing system of claim 13, wherein the MIP model is associated with a first group of components including allocation variables depending on allocation constraints, or a second group of components including fit variables depending on fit constraints such that the second group is an extension of the first group, wherein an allocation constraint of the first group represents well-plant combinations, and wherein the second group represents plant-time combinations such that a fit variable represents a maximum absolute deviation between modeled wells and historical inlet volumes for each plant and time period, wherein the one or more datasets comprise one or more of well data representing well production over time associated with the set of wells, plant data representing plant inlet volumes over time associated with the set of plants, well metadata relating to the set of wells, and plant metadata relating to the set of plants.

15. The data processing system of claim 13, wherein the pseudo cost comprises a number representing a cost associated with connecting a well with a plant based on factors including one or more of distance between the well and the plant and ownership value associated with the well or the plant, wherein a high pseudo cost indicates low probability of a connection between the well and the plant, wherein a low pseudo cost indicates high probability of the connection between the well and the plant, and wherein the fit weight comprises a value representing importance of matching modeled well volumes to known plant volumes, wherein the value of 0 indicates low importance of the matching, wherein the value of 1 indicates high importance of the matching, wherein the value of 0.5 indicates moderate importance of the matching.

16. The data processing system of claim 13, wherein the one or more matrices comprises one or more of a well volumes matrix representing a matrix of hydrocarbon production volumes for each well over time, a plant volumes matrix representing a matrix of gas processing plant inlet volumes for each plant over time, a pseudo costs matrix representing a matrix of pseudo costs for each well and each plant, and a fit weights matrix representing a matrix of fit weights for each well and each plant.

17. The data processing system of claim 13, wherein the feasible point represents a lowest objective function value of objective function values, wherein the lowest object function value is indicative of meeting of a threshold when the set of decision variables satisfy the set of constraints associated with the MIP model, wherein the objective function values correspond to rankings of solutions for the MIP mode.

18. The data processing system of claim 13, wherein the matrix of binary allocation variables is offered as a lowest solution of the MIP model based on the feasible point, wherein each element in the matrix indicates whether a specific well is allocated to a specific plant and wherein each of the set of wells is connected to at most one of the set of plants.

19. At least one non-transitory machine-readable medium having stored thereon instructions which, when executed by a machine, cause the machine to perform operations comprising:

receiving one or more datasets relating to hydrocarbon production associated with at least one of a set of wells and a set of plants, wherein the set of wells and the set of plants form one or more well-plant combinations;

processing the one or more datasets based on pseudo costs and fit weights, wherein processing includes assigning a pseudo cost to each of the one or more well-plant combinations, wherein processing further includes assigning one or more fit weights to one or more plant-time period combinations involving one or more plants of the set of plants and one or more time periods of a set of time periods associated with the one or more plants;

preparing to formulate a mixed-integer programming (MIP) model for the set of time periods based on the set of wells, the set of plants, a set of quarters, and a set of steps, wherein the MIP model facilitates determination of which of the set of wells are connected to which of the set of plants during a specific time period of the set of time periods;

formulating, based on a set of parameters, the MIP model based on one or more matrices associated with the one or more datasets, wherein the MIP model includes a set of constraints, a set of decision variables, and an objective function, wherein the set of parameters includes well volume parameters, plant volume parameters, threshold parameters, fit weight parameters, pseudo cost parameters, and fit penalty parameters, wherein a well volume parameter refers to a well-quarter combination representing designation of at least one well to at least one quarter, wherein a plant volume parameter refers to a plant-quarter combination representing designation of at least one plant to at least one quarter, wherein a threshold parameter references each of the set of steps, wherein a fit weight parameter refers to another plant-quarter combination representing designation of at least one plant to at least one quarter, wherein the pseudo cost parameter refers to a well-plant combination representing designation of at least one well to at least one plant, and wherein the fit penalty parameter references each of the set of steps;

solving the MIP model upon reaching a feasible point with a minimum objective value, wherein the feasible point is reached when the set of constraints is satisfied by the set of decision variables; and outputting a matrix of binary allocation variables for well-plant combinations between the set of wells and the set of plants, wherein the matrix of binary allocation variables is based on the feasible point of the MIP model.

20. The non-transitory machine-readable medium of claim 19, wherein the MIP model is associated with a first group of components including allocation variables depending on allocation constraints, or a second group of components including fit variables depending on fit constraints such that the second group is an extension of the first group, wherein an allocation constraint of the first group represents well-plant combinations, and wherein the second group represents plant-time combinations such that a fit variable represents a maximum absolute deviation between modeled wells and historical inlet volumes for each plant and time period, wherein the one or more datasets comprise one or more of well data representing well production over time associated with the set of wells, plant data representing plant inlet volumes over time associated with the set of plants, well metadata relating to the set of wells, and plant metadata relating to the set of plants.

21. The non-transitory machine-readable medium of claim 19, wherein the pseudo cost comprises a number representing a cost associated with connecting a well with a plant based on factors including one or more of distance between the well and the plant and ownership value associated with the well or the plant, wherein a high pseudo cost indicates low probability of a connection between the well and the plant, wherein a low pseudo cost indicates high probability of the connection between the well and the plant, and wherein the fit weight comprises a value representing importance of matching modeled well volumes to known plant volumes, wherein the value of 0 indicates low importance of the matching, wherein the value of 1 indicates high importance of the matching, wherein the value of 0.5 indicates moderate importance of the matching.

22. The non-transitory machine-readable medium of claim 19, wherein the one or more matrices comprises one or more of a well volumes matrix representing a matrix of hydrocarbon production volumes for each well over time, a plant volumes matrix representing a matrix of gas processing plant inlet volumes for each plant over time, a pseudo costs matrix representing a matrix of pseudo costs for each well and each plant, and a fit weights matrix representing a matrix of fit weights for each well and each plant.

23. The non-transitory machine-readable medium of claim 19, wherein the feasible point represents a lowest objective function value of objective function values, wherein the lowest object function value is indicative of meeting of a threshold when the set of decision variables satisfy the set of constraints associated with the MIP model, wherein the objective function values correspond to rankings of solutions for the MIP mode.

24. The non-transitory machine-readable medium of claim 19, wherein the matrix of binary allocation variables is offered as a lowest solution of the MIP model based on the feasible point, wherein each element in the matrix indicates whether a specific well is allocated to a specific plant and wherein each of the set of wells is connected to at most one of the set of plants.

\* \* \* \* \*